(12) United States Patent
Shih et al.

(10) Patent No.: US 9,134,604 B2
(45) Date of Patent: Sep. 15, 2015

(54) EXTREME ULTRAVIOLET (EUV) MASK AND METHOD OF FABRICATING THE EUV MASK

(71) Applicant: Taiwan Semiconductor Manufacturing Co., LTD, Hsinchu (TW)

(72) Inventors: Chih-Tsung Shih, Hsinchu (TW); Hsin-Chieh Yao, Hsinchu (TW); Shinn-Sheng Yu, Hsinchu (TW); Jeng-Horng Chen, Hsin-Chu (TW); Chung-Ju Lee, Hsinchu (TW); Anthony Yen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 113 days.

(21) Appl. No.: 14/015,885

(22) Filed: Aug. 30, 2013

(65) Prior Publication Data

US 2015/0064611 A1    Mar. 5, 2015

(51) Int. Cl.
*G03F 1/24* (2012.01)
*G03F 1/52* (2012.01)
*G03F 1/54* (2012.01)
*G03F 1/58* (2012.01)

(52) U.S. Cl.
CPC .. *G03F 1/58* (2013.01); *G03F 1/24* (2013.01); *G03F 1/52* (2013.01); *G03F 1/54* (2013.01)

(58) Field of Classification Search
CPC ............... G03F 1/24; G03F 1/52; G03F 1/54; G03F 1/58
USPC ............................................................ 430/5
See application file for complete search history.

(56) References Cited

U.S. PATENT DOCUMENTS 6,777,137 B2 *    8/2004    Fisch et al. ......................... 430/5

* cited by examiner

*Primary Examiner* — Christopher Young
(74) *Attorney, Agent, or Firm* — Maschoff Brennan (57) ABSTRACT

A Cu-containing material is provided as an absorber layer of an EUV mask. With the absorber layer of the Cu-containing material, the same lithography performance of a conventional absorber in 70 nm thickness of TaBN can be achieved by only a 30-nm thickness of the absorber layer according to the various embodiments of the present disclosure. Furthermore, the out-off-band (OOB) flare of the radiation light in 193-257 nm can be reduced so as to achieve the better lithography performance.

20 Claims, 6 Drawing Sheets

EXTREME ULTRAVIOLET (EUV) MASK AND METHOD OF FABRICATING THE EUV MASK

BACKGROUND

In the manufacture of integrated circuits (IC), patterns representing different layers of the IC are fabricated using a series of reusable photomasks ("masks") to transfer the design of each layer of the IC onto a semiconductor substrate during the manufacturing process. These layers are built up using a sequence of processes and resulted in transistors and electrical circuits. However, as the IC sizes continue to shrink, meeting accuracy requirements as well as reliability in multiple layer fabrication has become increasingly more difficult.

Photolithography uses an imaging system that directs radiation onto the photomask and then projects a shrunken image of the photomask onto a semiconductor wafer covered with photoresist. The radiation used in the photolithography may be at any suitable wavelength, with the resolution of the system increasing with decreasing wavelength. With the shrinkage in IC size, for printing in sub-32 nm half pitch node, extreme ultraviolet (EUV) lithography with a typical value 13.5 nm is one of the leading technologies for 16 nm and smaller node device patterning. The pattern is formed from absorptive features or lines etched into the mask.

A patterning issue in EUV lithography is the shadowing effect due to oblique illumination. This effect can cause critical dimension (CD) errors up to a few nanometers. Therefore, this effect needs to be compensated during mask synthesis.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a gate stack includes embodiments having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

The EUV lithography is an exposure technique using EUV light. The EUV refers a ray having a wavelength in a soft X-ray region or a vacuum ultraviolet ray region. Specifically, an EUV ray has a wavelength of about 10 to 20 nm, particularly about 13.5 nm±0.3 nm. In the MN lithography, illumination is cast on the EUV mask at an angle, e.g., 5° relative to the axis perpendicular to a plane of the mask. Due to this oblique illumination and absorber thickness on the EUV mask, shadows are formed around side walls of patterns represented by the absorber shapes that can make the absorber shapes to appear wider. Because the light is incident onto the reflective photomask at an angle, the absorber pattern that protrudes from the reflective surface on the photomask can cast a shadow the resulting pattern. This mask pattern widening due to a shadowing effect is passed on to the wafer image through the optical system and resist process, resulting in critical dimension (CD) errors up to a few nanometers in the printed patterns on the wafer. The shadowing effect can blur the image and cause CD errors up to a few nanometers (nm). Therefore, this effect needs to be resolved in mask fabrication.

According to various embodiments of the present disclosure, a copper (Cu)-containing material, which is highly-absorptive for the EUV wavelength band, is provided as an absorber layer of the EUV mask. With the absorber layer of the Cu-containing material, the same lithography performance of a conventional absorber in 70 nm thickness made of e.g. a nitride of tantalum boron alloy (TaBN) can be achieved by only a 30-nm thickness of the absorber layer according to the various embodiments of the present disclosure. Since shadows are formed around steps with thickness, due to the oblique illumination, represented by the absorber pattern on the EUV mask, a reduced thickness of the absorber improves the shadowing effect of the EUV mask.

There are additional challenges to the camera optics system for transferring a pattern to the wafer, including the optics deformation, contamination, source stability, dose uniformity, shot noise, flare (stray lights), optical contrast, etc. In the EUV lithography, there is a problem caused by Out of Band (OoB) light which is included in light generated from a light source of EUV exposure apparatus and has a wavelength outside EUV region. At unexposed portions of a resist film, Oob flare that is generated with OoB light occurs, and thus selectivity of the exposed region during EUV irradiation is lost. Therefore, such OoB flare causes deterioration of contrast of a resist pattern, thickness loss and roughness (surface roughness of the side walls and the top surface of the pattern). In particular, roughness causes defects in the shape of the resist pattern. For example, roughness on the side wall surfaces of a pattern can cause various defects such as non-uniformity of the line width of line and space patterns, or distortions around the holes in hole patterns. According to various embodiments of the present disclosure, the OoB flare of the radiation light in 193-257 nm can be reduced so as to achieve the better lithography performance. Improvements to the state of the art are necessary if a reliable source technology for lithography is to be found.

Photolithography uses an imaging system that directs radiation onto a mask to form a pattern and then projects the image of that a reduced pattern onto a semiconductor wafer covered with light-sensitive photoresist. The pattern is formed from absorptive features or lines etched into the mask. The radiation used in photolithography may be at any suitable wavelength, with the resolution of the system increasing with decreasing wavelength. The ability to print smaller features onto the semiconductor wafer improves as the resolution increases. Concerning EUV lithography, it is based on exposure with the portion of the electromagnetic spectrum having a wavelength of 10-15 nanometers. An EUV step-and-scan tool may have a 4-mirror, 4x-reduction projection system with a 0.10 Numerical Aperture (NA). Exposure is accomplished by stepping fields over a wafer and scanning the EUV mask across each field. A CD of 50-70 nm may be achieved with a depth of focus (DOF) of about 1 micrometer (urn). Alternatively, a 6-mirror, 4x-reduction projection system may be applied with a 02.5 NA to print a smaller CD of 20-30 nm, at the expense of a reduced DOF. Other tool designs with a 5x- or a 6x-reduction projection system may also be used for EUV lithography.

Figure 1:
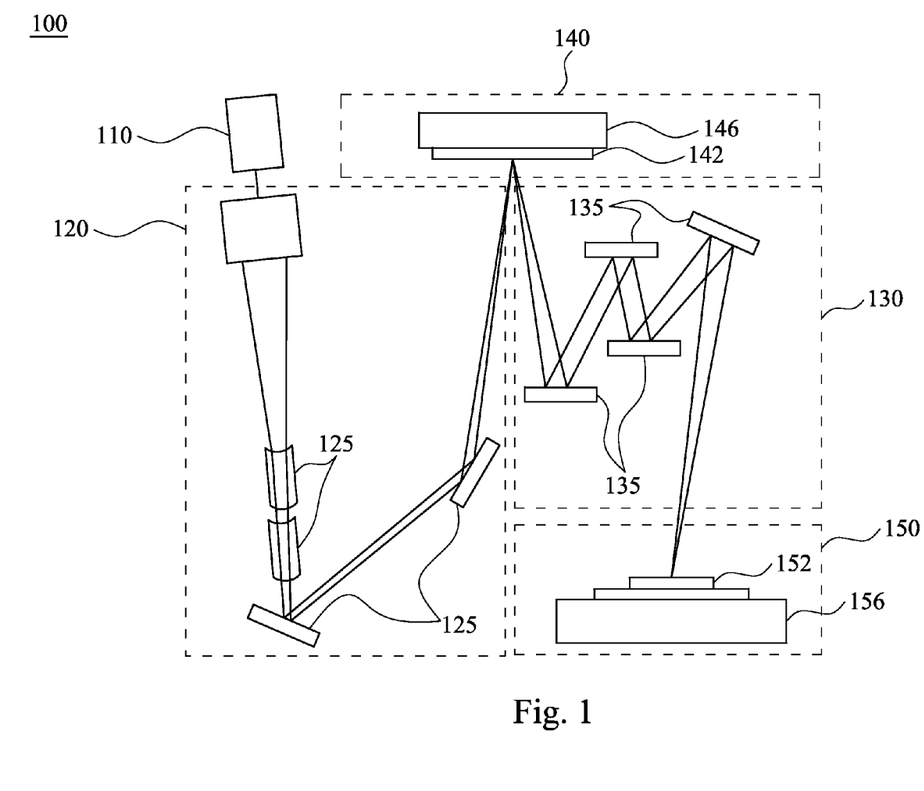
FIG. 1 is a block diagram of a photolithography imaging system that uses a mask in processing a wafer.

Referring to FIG. 1, an EUV lithography imaging system 100 includes a radiation source 110, a condenser optics section 120, a projection optics section 130, a mask stage 140, and a wafer stage 150. The radiation source 110 may be any source able to produce radiation in the EUV wavelength range. One example of a suitable radiation source 110 is a plasma created when a laser illuminates a gas, such as a supersonic jet of xenon gas. As another example, a suitable radiation source 110 may be formed using bending magnets and undulators associated with synchrotrons. As a further example, a suitable radiation source 110 may be formed or developed from discharge sources, which have the potential to provide adequate power in the desired wavelength range. EUV radiation is strongly absorbed in virtually all transmissive materials, including gases and glasses. To minimize unwanted absorption, EUV imaging is carried out in near vacuum.

The condenser optics section 120 brings the radiation from the source 110 to the mask stage 140. In the EUV lithography imaging system 100, the condenser optics are reflective because EUV radiation is strongly absorbed in traditionally transmissive materials such as lenses, which may be used in traditional photolithography imaging systems. Accordingly, the condenser optics section 120 includes condenser reflectors or mirrors 125 that collect and focus the radiation from the source 110 onto the mask stage 140. Any number of condenser mirrors 125 may be used, such as, for example, the four shown in FIG. 1.

The mask stage 140 includes a transport stage 146 that scans a mask 142. In the EUV lithography imaging system 100, the mask 142 is reflective because EUV radiation is strongly absorbed in most materials such as transmissive photomasks that are used in traditional photolithography imaging systems.

The projection optics section 130 reduces the image from the mask 140 in the mask stage 140 and forms the image onto wafer 152 in the wafer stage 150. In the EUV lithography imaging system 100, the projection optics are reflective because of the absorption associated with EUV radiation. Accordingly, the projection optics section 130 includes reflectors or mirrors 135 that project radiation reflected from the mask 140 onto the wafer. The reflectance spectrum of the mask 142 may be matched to that of the mirrors in the projection optics section 130. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used.

The wafer stage 150 includes a transport stage 156 that scans a semiconductor wafer 152 in synchrony with the mask 142 and steps the wafer 152 into a position to accept a next image from the mask 142. During operation, a semiconductor wafer 152 mounted to the transport stage 156. The projection optics convey the radiation light with a pattern in its cross-section to create a pattern in a target portion of the wafer 152. It should be noted that the pattern conveyed to the radiation light may not exactly correspond to the desired pattern in the target portion of the wafer, for example if the pattern includes phase-shifting features or shadows. Generally, the pattern conveyed to the radiation light will correspond to a particular functional layer in a device being created in a target portion of the wafer 152, such as an IC.

Figure 2A:
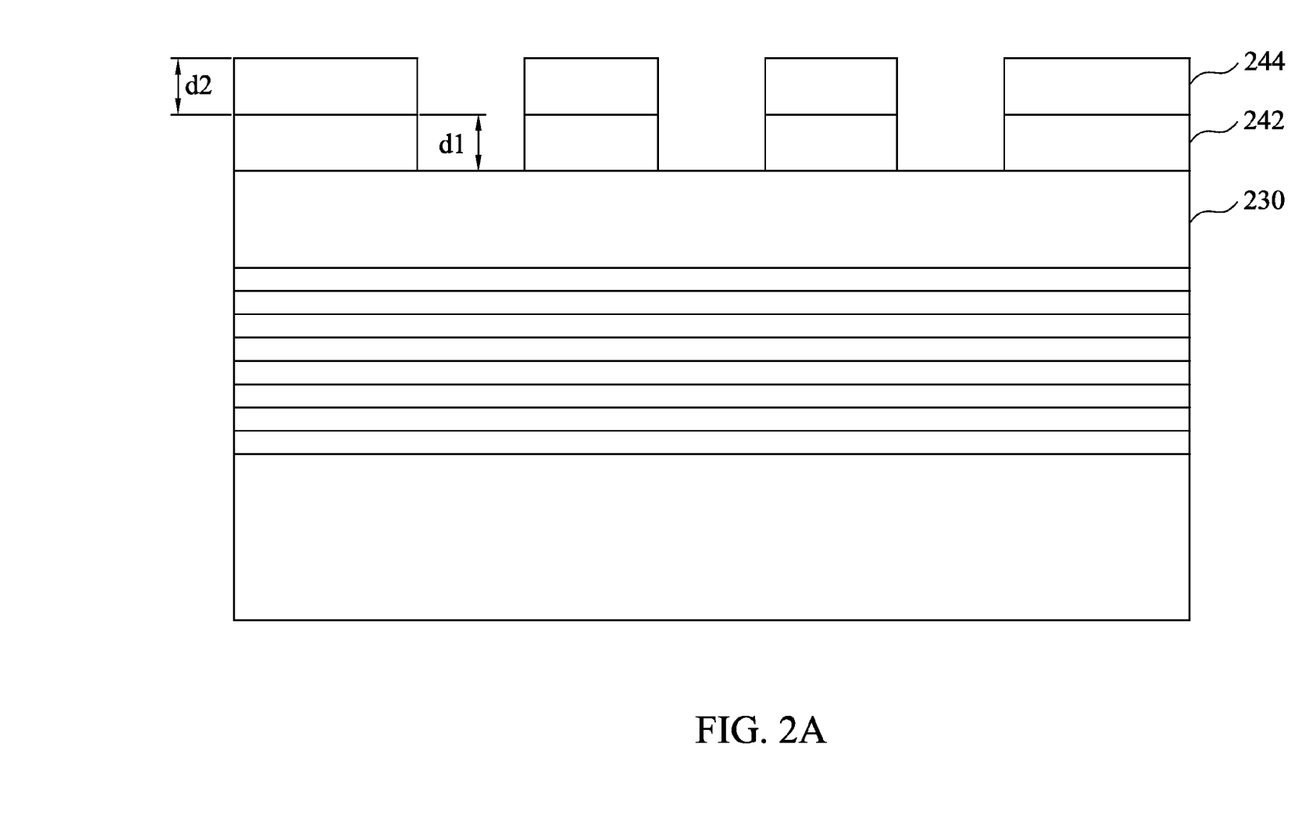
FIG. 2A is a cross-sectional view schematically illustrating an EUV mask according to various embodiments of the present disclosure.

FIG. 2A is a cross-sectional view schematically illustrating an EUV mask 200, having a patterned absorber layer 242 and 244, according to various embodiments of the present disclosure. A mask 200 shown in FIG. 2A includes a substrate 210, a reflective multilayer (ML) coating 220 for reflecting EUV light, a buffer layer 230 for protecting or capping the reflective ML coating 220 formed in this order on the substrate 210. On the buffer layer 230, the patterned absorber layer 242 and 244 is formed.

During the printing, up to about 40% of the EUV light is absorbed by the mask, and thermal expansion caused by the heating leads to a large image distortion that may exceed the error tolerance. Low thermal expansion material (LTEM) has been proposed as the substrate material for the substrate of the EUV masks. The substrate 210 may have a low thermal expansion coefficient (for example, the thermal expansion coefficient within a temperature range of from 19° C. to 27° C. is 0±1.0×10$^{-7}$/° C. In various embodiments, the thermal expansion coefficient is 0±0.3×10$^{-7}$/° C., 0±0.2×10$^{-7}$/° C., 0±0.1×10$^{-7}$/° C., or 0±0.05×10$^{-7}$/° C. A glass having a low thermal expansion coefficient, such as a β quartz may be used as the substrate 210. Further, a film such as a stress correcting film (not shown) may be formed on the substrate 210.

The reflective MI coating 220 of the EUV mask is used to achieve a high EUV light reflectance. The reflective ML coating 220 is a type of Bragg reflector that reflects light at a selected wavelength through constructive interference. The selection of materials in the ML coating 220 depends on the radiation wavelength (λ) to be reflected. Each layer of the ML coating 220 has a thickness of about one quarter of λ. In particular, the thickness of the respective layers of the ML coating 220 depends on the radiation wavelength λ, and the incidence angle of the radiation light. For EUV, the λ is 13.5 nm and the incidence angle is about 5 degrees. Using many reflecting film pairs, over 60% reflectance for light having a wavelength in the vicinity of 13.5 nm is achieved. The thicknesses of the alternating layers are tuned to maximize the constructive interference (Bragg reflection) of the EUV light reflected at each interface and to minimize the overall absorption of the EUV light. The ML coating 220 can achieve about 60-75% reflectivity at the peak radiation wavelength. The reflective ML coating 220 is formed by sequentially stacking materials 222/224 having different optical properties. The Bragg reflection which occurs at the interface of the materials 221/222 may be used. The reflectivity of the reflective ML coating 220 is proportional to the square of the difference between the refractive indexes (real parts of complex refractive indexes) of the two materials 222/224 which are alternately stacked. In addition, the wavelength and maximum reflectivity of the reflected EUV light are determined based upon the kinds of the materials 222/224.

In various embodiments, the ML coating 220 has 30 pairs to about 60 pairs of alternating layers of a high index of refraction material 222 and a low index of refraction material 224. For example, 40 pairs of the alternative layers 222/224 of the ML coating 220 are deposited in which the high index of refraction material 222 may be formed from about 2.8 nm thick Molybdenum (Mo) while the low index of refraction material 224 may be formed from about 4.1 nm thick Silicon (Si).

A buffer layer or a capping layer 230, such as about 11 nm thick Ruthenium (Ru), may be formed at the top of the ML coating 220. Molybdenum can oxidized under ambient conditions. The capping layer 230 prevents oxidation of Molybdenum. The capping layer may be oxidized during production of a mask or during operation of the mask during semiconductor fabrication (such as a cleaning, defect inspection, heating, dry etching or defect correcting step). Other metals may be used as the capping layer. In some embodiments, chromium may be used.

According to various embodiments of the present disclosure, an absorber layer 240 made of Cu-containing material is formed over the reflective ML coating 220. In various embodiments, the absorber layer 240 has a thickness less than 40 nm. For example, the absorber layer 240 has a thickness of 30 nm. In some embodiments, the absorber layer 240 is a dual-layer stack having a first layer 242 and a second layer 244. In some embodiments, the first layer is made of APC [Ag:PdCu] or Cu and the second layer is made of ITO [indium tin oxide]. For example, the dual-layer stack is composed of a first layer 242 of APC having Ag:PdCu=99:1 in weight %, and a second layer 244 of ITO having $In_2O_3:SnO_2$=90:10 in weight %. In some embodiments of the present disclosure, the first layer 242 of APC has a thickness d1 equal to thickness d2 of the second layer 244 of ITO. In other embodiments, the thickness d1 is larger than the thickness d2. In embodiments, the thickness d1 is twice of the thickness d2. As embodiments, more than one dual-layer stack may be deposited over the reflective ML coating 220. In the embodiments, a multiple dual-layer stack may be made of APC/ITO, Cu/ITO, or a combination of APC/ITO and Cu/ITO. Further, in embodiments, the dual-layer stack may be Cu/ITO or a Cu-only absorber layer. Because of high absorbability of Cu, the thickness of the absorber according to various embodiments of the present disclosure can be reduced, with respective with that of the conventional absorber layer. As aforementioned, since shadows are formed around steps with thickness, due to the oblique illumination, represented by the absorber pattern on the EUV mask, a reduced thickness of the absorber improves the shadowing effect of the EUV mask.

Figure 2B:
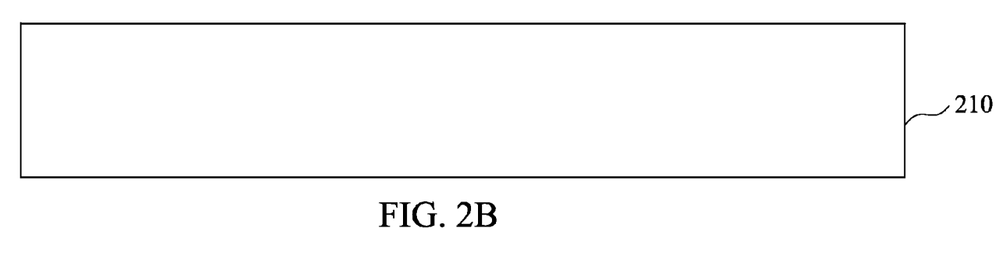
FIG. 2B is a cross-sectional view schematically illustrating an EUV mask according to various embodiments of the present disclosure.
Figure 2C:
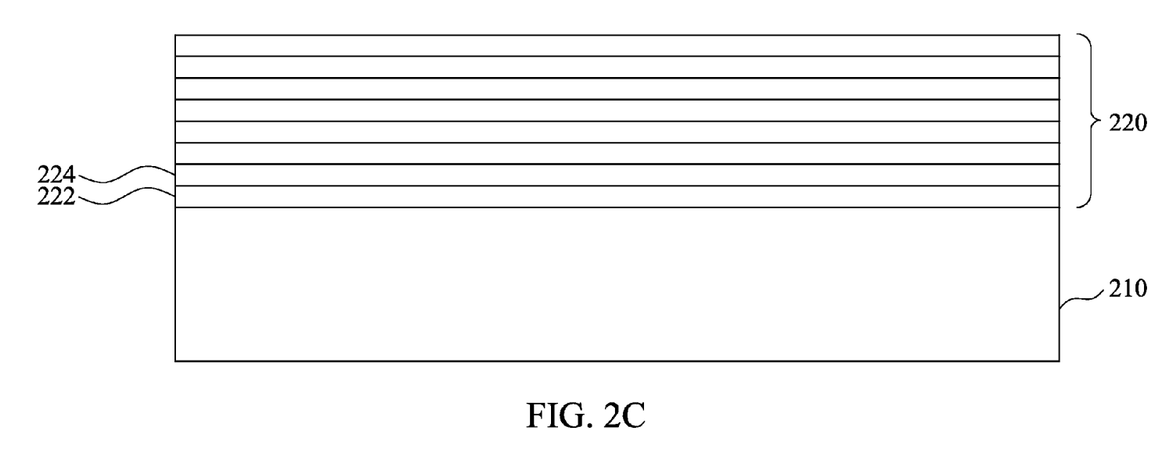
FIG. 2C is a cross-sectional view schematically illustrating an EUV mask according to various embodiments of the present disclosure.
Figure 2D:
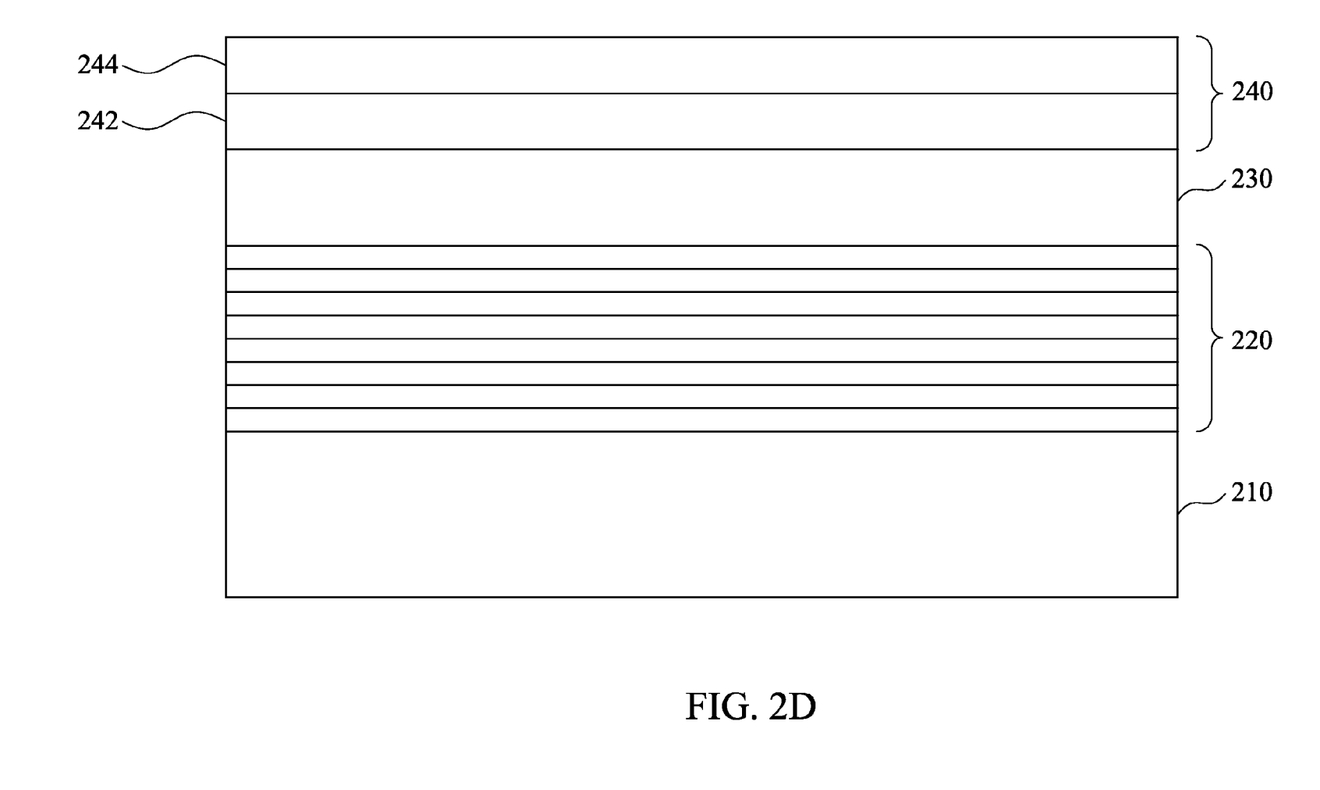
FIG. 2D are diagrammatic cross-sectional side views of the EUV mask of FIG. 2A at various stages of fabrication according to various embodiments of the present disclosure.

FIGS. 2B-2D are the cross-sectional side views of the EUV mask 200 of FIG. 2A at various stages of manufacture according to various embodiments of the present disclosure. For reasons of simplicity, FIGS. 2A-2D may only illustrate a part of the EUV mask.

In FIG. 2B, a substrate 210 with a low defect level and a smooth surface is used as the starting material for the EUV mask 200 in the present disclosure. It is desired to form the substrate 210 out of a glass or glass-ceramic material that has a low coefficient of thermal expansion (CTE). For example, the substrate 210 may be formed of β-quartz.

Referring to FIG. 2C, a reflective ML coating 220 is deposited over the substrate 210. The reflective ML coating 220 has about 30-60 pairs of alternating layers of a high index of refraction material 222 and a low index of refraction material 224. In embodiments, the reflective ML coating 220 has 40 pairs of the alternative layers 222/224. A high index of refraction material 222 includes elements with high atomic number which tend to scatter EUV light. A low index of refraction material 224 includes elements with low atomic number which tend to transmit EUV light. The reflective ML coating 220 is formed over the substrate 210 by using ion beam deposition (IBD) or DC magnetron sputtering. The thickness uniformity should be better than 0.8% across the substrate 210. IBD results in less perturbation and fewer defects in the upper surface of the reflective ML coating 220 because the deposition conditions can usually be optimized to smooth over any defect, on the substrate 210. In various embodiments, the ML coating 220 has 30 pairs to about 60 pairs of alternating layers of a high index of refraction material 222 and a low index of refraction material 224. For example, 40 pairs of the alternative layers 222/224 of the ML coating 220 are deposited in which the high index of refraction material 222 may be formed from about 2.8 nm thick Mo while the low index of refraction material 224 may be formed from about 4.1 nm thick Si.

As various embodiments, in fabricating an EUV mask, a substrate 210 may be provided having the reflective ML coating 220 thereon. In this case of the substrate 210 with the reflective ML coating 220, the operation in FIG. 2C may be omitted in the method of fabricating the EUV mask according to the embodiments of the present disclosure.

As shown in FIG. 2D, a buffer layer 230 is formed over the reflective ML coating 220. A buffer layer (not shown) may be formed over the capping layer 230. The buffer layer may act later as an etch stop layer for patterning of the overlying absorber 240. Furthermore, the buffer layer may also serve later as a sacrificial layer for focused ion beam (RB) repair of defects in the absorber 240. The buffer layer may have a thickness of about 20-60 nm. The buffer layer may be formed from silicon dioxide ($SiO_2$) or a silicon (Si) layer. As embodiments, the buffer layer may a Ru capping layer formed at the top of the ML coating 220 to prevent oxidation of Mo by exposure to the environment. The buffer layer 230 may be low temperature oxide (LTO) as $SiO_2$, or other materials, such as silicon oxynitride (SiOxNy) or carbon (C).

Still referring to FIG. 2D, an absorber layer 240 is formed over the buffer layer 230, in various embodiments of the present disclosure, the absorber layer 240 is formed from a Cu-containing material, which is highly-absorptive for the EUV wavelength band. The absorber layer 240 has a total thickness less than 40 nm. The absorber layer 240 may be deposited by RF sputtering, DC sputtering, ion beam deposition (IBD) or atomic layer chemical vapor deposition (ALD). According to various embodiments of the present disclosure, the absorber layer is Cu, Ag—Pd—Cu (APC), Cu/Indium Tin Oxide (ITO) or APC/ITO.

In various embodiments, shown in FIG. 2D, the absorber layer 240 is a dual-layer stack including a first layer 242 and a second layer 244. As embodiments, the first layer is made of APC or Cu and the second layer is made of ITO. In the embodiments, a multiple dual-layer stack may be made of APC/ITO, Cu/ITO, or a combination of APC/ITO and Cu/ITO. Further, in embodiments, the dual-layer stack may be Cu/ITO or a Cu-only absorber layer Referring to FIG. 3, in some embodiments, a capping layer 326 made of SiC is deposited on the reflective ML layer 320. Because the Mo layer in the reflective ML coating 320 can become oxidized under ambient conditions, the capping layer 326 of SiC prevents oxidation of the Mo layer. In certain embodiments, the capping layer 326 of SiC has a thickness of 2-7 nm, and for example, a thickness of 5 nm. In some embodiments, the capping layer 326 is made of Ruthenium (Ru) having, for example, a thickness of 2.5 nm.

Figure 3:
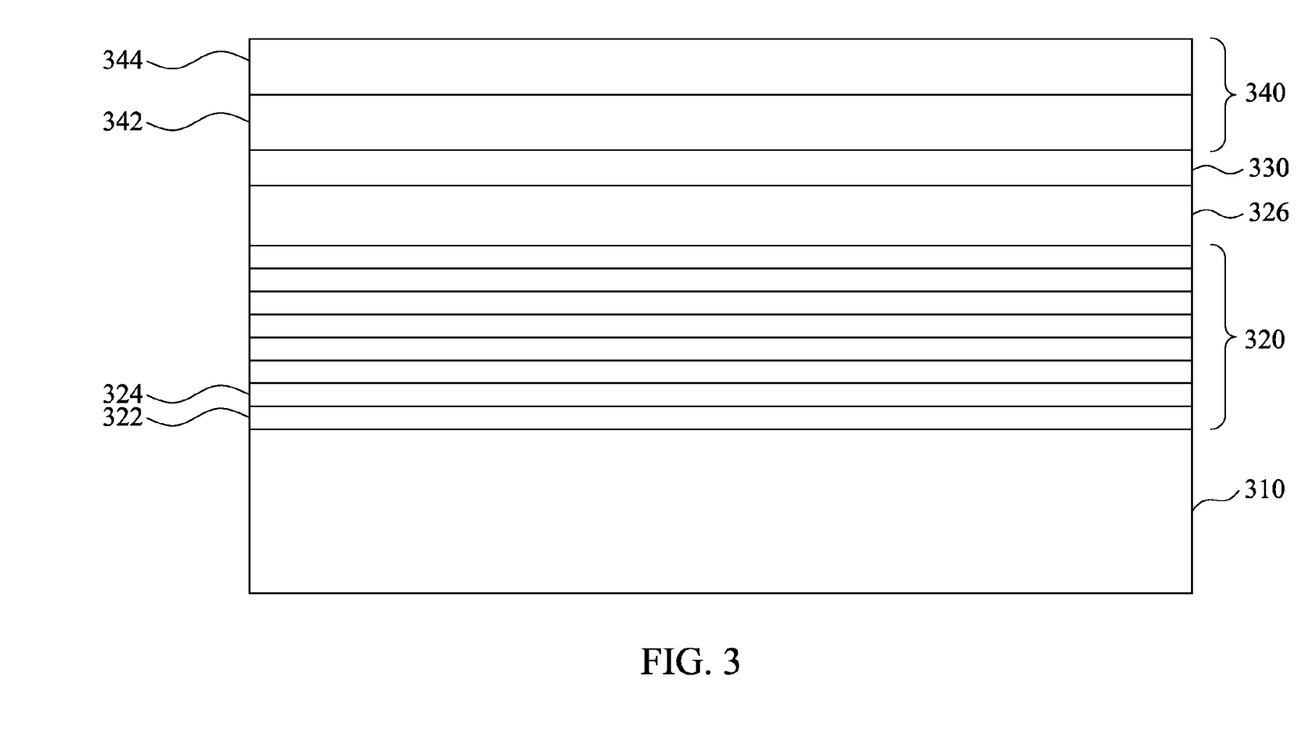
FIG. 3 is a cross-sectional view schematically illustrating an UN mask according to various embodiments of the present disclosure.

The buffer layer 330 may be formed over the capping layer 326. The buffer layer 330 may have a thickness of about 20-60 nm. The buffer layer may be formed from silicon dioxide ($SiO_2$) or a silicon (Si) layer. In various embodiments, the buffer layer may the capping layer 326 itself formed at the top of the ML coating 320 to prevent oxidation of Mo by exposure to the environment. The buffer layer 330 may be low temperature oxide (LTO) as $SiO_2$, or other materials, such as silicon oxynitride (SiOxNy) or carbon (C). The buffer layer 330 may act later as an etch stop layer for patterning of the overlying absorber 340 formed in the following operation. In some embodiments, the capping layer 326 of SiC may be the buffer layer 330; that is, the buffer layer 330 is the same layer of the capping layer 326 of SiC and acts as the capping layer. Furthermore, the buffer layer 330 may also serve later as a sacrificial layer for focused ion beam (FIB) repair of defects in the absorber 340. The buffer layer 330 may be deposited by a suitable process such as magnetron sputtering and ion beam sputtering.

Still referring to FIG. 3, an absorber layer 340 is formed over the buffer layer 330 or the capping layer 326 according to various embodiments of the present disclosure. In embodiments, the absorber layer 340 has a total thickness d raging from 30-70 nm. The absorber layer 340 may be deposited by RF sputtering, DC sputtering, ion beam deposition (IBD) or atomic layer chemical vapor deposition (ALD). In various embodiments, shown in FIG. 3, the absorber layer 340 is a dual-layer stack including a first layer 342 and a second layer 344 made of highly absorptive materials to the radiation of wavelength at 13.5 nm. Patterning the absorber layer 340 includes forming a photoresist pattern over the absorber layer 340 in an absorption region, etching the absorber layer 340 by using the photoresist pattern as an etch mask to form an absorber pattern, and removing the photoresist pattern. In particular, the absorber layer 340 may be covered with a radiation-sensitive layer, such as photoresist, that is coated, exposed, and developed with a desired pattern. The photoresist pattern has a thickness of about 160-640 nm. As desired, a chemically-amplified resist (CAR) may be used. Depending on the photoresist pattern used, exposure is performed on an electron beam (e-beam) writer or a laser writer. Reactive ion etch may be used. For example, an absorber layer 340 may be dry etched with a gas that contains chlorine, such as $Cl_2$ or $BCl_3$, or with a gas that contains fluorine, such as $NF_3$. Argon (Ar) may be used as a carrier gas. In some cases, oxygen ($O_2$) may also be included as carrier. The etch rate and the etch selectivity depend on the etchant gas, etchant flow rate, power, pressure, and substrate temperature. The buffer layer 330 may serve as an etch stop layer to help achieve a good etch profile in the overlying absorber layer 340. The buffer layer 330 protects the underlying reflective ML coating 320 from damage during etch of the absorber layer 340.

Figure 4:
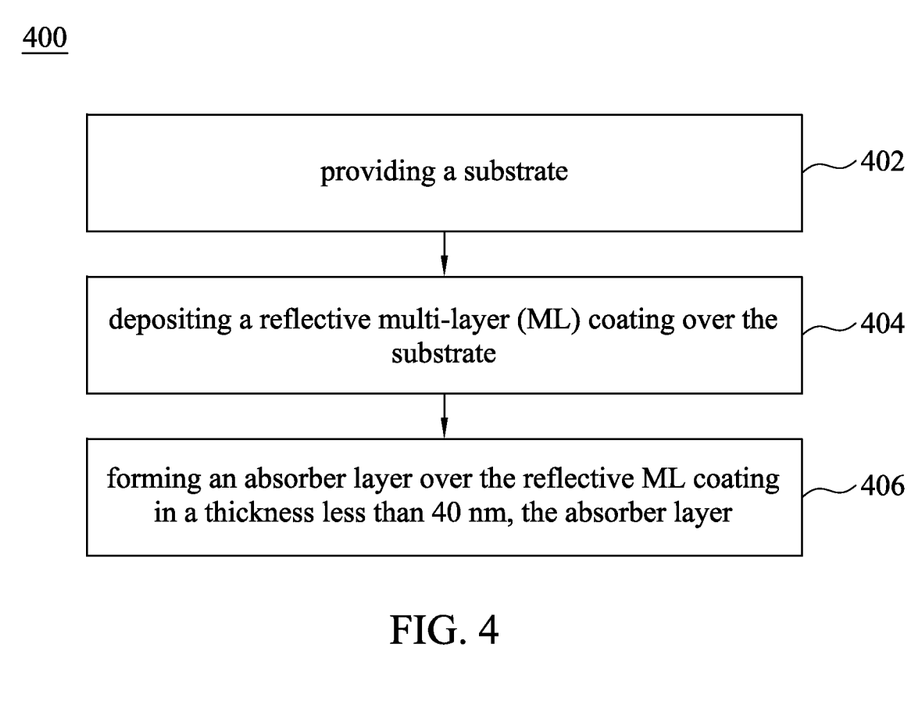
FIG. 4 is a flowchart illustrating a method of fabricating an EUV mask according to various embodiments of the present disclosure.

FIG. 4 is a flowchart illustrating a method of fabricating a method of fabricating an EUV mask according to various embodiments of the present disclosure. The operations are explained in the cross-sectional side views of a portion of the EUV mask 200 from FIGS. 2A to 2D at various fabrication stages according to various embodiments of the present disclosure. It is understood that FIGS. 2A-2D have been simplified for a better understanding of the inventive concepts of the present disclosure.

In FIG. 4, a substrate 210 is provided in operation 402. Referring to FIG. 2B, the substrate 210 is made of a material having a low coefficient of thermal expansion (CTE). For example, the substrate 210 may be formed of β-quartz.

Referring to the operation 404, a reflective ML coating 220 is deposited over the substrate 210. In FIG. 2C, the reflective ML coating 220 has about 30-60 pairs of alternating layers of a high index of refraction material 222 and a low index of refraction material 224. In embodiments, the reflective ML coating 220 has 40 pairs of the alternative layers 222/224.

As various embodiments, in fabricating an EUV mask, a substrate 210 may be provided having the reflective ML coating 220 thereon. In this case of the substrate 210 with the reflective ML coating 220, the operation 304 in FIG. 4 may be omitted in the method of fabricating the EUV mask according to the embodiments of the present disclosure.

In embodiments, the method of fabricating the EUV mask further includes an operation of forming a buffer layer 230 over the reflective ML coating before forming the absorber layer 240. A buffer layer (not shown) may be formed over the capping layer 230, which may be made of SiC or Ru. The buffer layer may act later as an etch stop layer for patterning of the overlying absorber 240. Furthermore, the buffer layer may also serve later as a sacrificial layer for focused ion beam (FIB) repair of defects in the absorber 240. The buffer layer may have a thickness of about 20-60 ran. The buffer layer may be formed from Silicon Dioxide ($SiO_2$). For example, the buffer layer may a Ru capping layer formed at the top of the ML coating 220 to prevent oxidation of Mo by exposure to the environment. The buffer layer 230 may be Silicon Dioxide ($SiO_2$), such as low temperature oxide (LTO), or other materials, such as Silicon Oxynitride (SiOxNy) or Carbon (C).

Referring to the operation 406 of FIG. 4, the second layer 244 is stacked on the first layer 242 of FIG. 2D. In FIG. 2D, the absorber layer includes a first layer 242 and a second layer 244. For the first layer 242, the layer is made of APC or Cu; and the second layer is made of ITO in a total thickness of 30 nm. The desired pattern on an EUV mask is defined by selectively removing an absorber layer to uncover portions of an underlying mirror coated on a substrate, using Tantalum (Ta) and Ta-alloy films as the absorber material of masks for EUV light. The absorber layer 240 to be as thin as practicable in order to minimize any shadowing effect during exposure. In embodiments, the absorber layer 240 is Cu-containing material with a thickness of 30-40 nm. The EUV illumination beam typically has an incidence angle of about 5 degrees so minimizing any shadowing during exposure will reduce print bias. Similarly, minimizing any shadowing during etch of the absorber layer 240 will reduce etch bias. The etch bias for Tantalum Nitride can be reduced to less than 10 nm. Reducing print bias and etch bias will make it easier for an e-beam writer to resolve the features to be patterned on the EUV mask.

According to various embodiments of the present disclosure, the method of fabricating the EUV mask further includes an operation of forming a resist layer over the absorber layer, patterning the resist layer to form a trench with a trench width, and etching through the absorber layer to expose the reflective ML coating and removing the resist layer. As a result, the patterned absorber layer 240 of FIG. 2A is formed accordingly.

Given the above, according to various embodiments of the present disclosure, the highly-absorptive materials such a Cu-containing material is provided as an absorber layer of the EUV mask. With the absorber layer of the Cu-containing material, the same lithography performance of a conventional absorber in 70 nm thickness made of e.g. a nitride of tantalum boron alloy (TaBN) can be achieved by only a 30-nm thickness of the absorber layer according to the various embodiments of the present disclosure. Furthermore, with the improvement of absorbability to the absorber layer of the Cu-containing material, the lost in the selectivity of the exposed region during EUV irradiation is reduced. Therefore, the OoB flare of the radiation light in 193-257 nm can also be reduced, so as to achieve the better lithography performance.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An extreme ultraviolet (EUV) mask, comprising:
   a substrate;
   a reflective multilayer (ML) coating over the substrate; and
   an absorber layer over the reflective ML coating,
   wherein the absorber layer is a dual-layer stack having a first layer and a second layer over the first layer, and the first layer is made of Ag—Pd—Cu (APC) or Cu and the second layer is made of Indium Tin Oxide (ITO).

2. The EUV mask of claim 1, wherein the absorber layer is a multiple dual-layer stack.

3. The EUV mask of claim 2, wherein the multiple dual-layer stack is made of dual-layer stacks made of APC and ITO, dual-layer stacks made of Cu and ITO, or a combination of dual-layer stacks made of APC and ITO and dual-layer stacks made of Cu and ITO.

4. The EUV mask of claim 1, wherein a thickness of the first layer is equal to or larger than a thickness of the second layer.

5. The EUV mask of claim 4, wherein the thickness of the first layer is twice the thickness of the second layer.

6. The EUV mask of claim 1, further comprising a buffer layer, wherein the buffer layer is between the reflective ML coating and the absorber layer, and wherein the buffer layer acts as a capping layer.

7. The EUV mask of claim 6, wherein the buffer layer is made of an insulative material selected from the group consisting of silicon dioxide, silicon oxynitride, carbon, silicon carbide (SiC) and ruthenium (Ru), and the substrate is made of a low thermal expansion material.

8. The EUV mask of claim 6, wherein the reflective ML coating is made of alternating layers of molybdenum (Mo) and silicon (Si), and wherein the number of alternating layers is in a range from about 30 pairs to about 60 pairs.

9. The EUV mask of claim 3, wherein the APC has Ag:PdCu=99:1 in weight % and ITO has In2O3:SnO2=90:10 in weight %.

10. The EUV mask of claim 1, wherein the absorber layer comprises at least one etch opening through which the reflective ML coating is exposed.

11. An EUV mask, comprising:
    a substrate;
    a reflective multilayer (ML) coating over the substrate; and
    a dual-layer absorber having a thickness less than 35 nm.

12. The EUV mask of claim 11, wherein the dual-layer absorber is made of copper (Cu)-comprising material.

13. The EUV mask of claim 12, wherein the dual-layer absorber has a first layer and a second layer, wherein the first layer is APC or Cu and the second layer is ITO.

14. The EUV mask of claim 13, wherein the thickness of the first layer is equal to or larger than the thickness of the second layer.

15. A method of fabricating an extreme ultraviolet (EUV) mask comprising:
    providing a substrate;
    depositing a reflective multi-layer (ML) coating over the substrate; and
    forming an absorber layer over the reflective ML coating in a thickness less than 40 nm, wherein forming the absorber layer comprises forming a first layer and stacking a second layer on the first layer, wherein forming the first layer comprising depositing the first layer with Ag—Pd—Cu (APC) or Cu and forming the second layer comprising depositing the first layer with Indium Tin Oxide (ITO).

16. The method of claim 15, further comprising forming a buffer layer over the reflective ML coating before forming the absorber layer.

17. The method of claim 15, wherein forming the first layer and stacking the second layer on the first layer are performed multiple times.

18. The method of claim 15, further comprising forming a resist layer over the absorber layer, patterning the resist layer to form a trench with a trench width, and etching through the absorber layer to expose the reflective ML coating and removing the resist layer.

19. The method of claim 15, wherein the thickness of the absorber layer is less than 40 nm.

20. The method of claim 17, wherein the multiple formed first layer and second layer form multiple dual-layer stacks, the multiple dual-layer stacks including dual-layer stacks made of APC and ITO, dual-layer stacks made of Cu and ITO, or a combination of dual layer stacks made of APC and ITO and dual layer stacks made of Cu and ITO.

* * * * *